United States Patent
Inaba et al.

(10) Patent No.: US 7,978,543 B2
(45) Date of Patent: Jul. 12, 2011

(54) SEMICONDUCTOR DEVICE TESTABLE ON QUALITY OF MULTIPLE MEMORY CELLS IN PARALLEL AND TESTING METHOD OF THE SAME

(75) Inventors: Hideo Inaba, Tokyo (JP); Tadashi Onodera, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 116 days.

(21) Appl. No.: 12/488,920

(22) Filed: Jun. 22, 2009

(65) Prior Publication Data

US 2009/0316495 A1 Dec. 24, 2009

(30) Foreign Application Priority Data

Jun. 23, 2008 (JP) ................................. 2008-163498

(51) Int. Cl.
*G11C 7/10* (2006.01)
(52) U.S. Cl. ......... 365/189.17; 365/189.18; 365/189.04; 365/189.05; 365/189.08; 365/193
(58) Field of Classification Search ............ 365/189.17, 365/189.18, 189.04, 189.05, 189.08, 193
See application file for complete search history.

(56) References Cited

U.S. PATENT DOCUMENTS

| | | | | |
|---|---|---|---|---|
| 6,046,947 A * | 4/2000 | Chai et al. | ...................... | 365/201 |
| 6,134,688 A * | 10/2000 | Sachdev | ........................ | 714/727 |
| 6,456,561 B2 * | 9/2002 | Maeda | ...................... | 365/189.05 |
| 6,535,412 B1 * | 3/2003 | Maruyama et al. | ............. | 365/63 |
| 6,898,139 B2 * | 5/2005 | Lee et al. | ........................ | 365/221 |
| 7,240,253 B2 * | 7/2007 | Yoshida et al. | ............... | 714/718 |
| 7,280,417 B2 * | 10/2007 | Choi et al. | ...................... | 365/193 |
| 7,327,766 B2 * | 2/2008 | Stief | .............................. | 370/537 |
| 7,362,626 B2 * | 4/2008 | Ware et al. | ...................... | 365/194 |
| 7,447,962 B2 * | 11/2008 | Horie | ............................. | 714/727 |
| 7,710,792 B2 * | 5/2010 | Arai | .......................... | 365/189.05 |
| 7,898,884 B2 * | 3/2011 | Dono et al. | .................... | 365/201 |

FOREIGN PATENT DOCUMENTS

| | | |
|---|---|---|
| JP | 2569113 | 10/1996 |
| JP | 2003-132681 | 5/2003 |

* cited by examiner

*Primary Examiner* — Viet Q Nguyen
(74) *Attorney, Agent, or Firm* — Young & Thompson

(57) ABSTRACT

A semiconductor device includes: first and second input/output terminals; a first input/output line connected to the first input/output terminal; a second input/output line connected to the second input/output terminal; and a first by-path route that connects the first input/output line and the second input/output line. When in normal operation mode, the first by-path route is set in a non-conductive state. When in a test mode, the first by-path route is set into a conductive state so that a first data inputted to the first input/output terminal is outputted as a first data to the second input/output line, in correspondence with a transition of a clock signal in the first direction, and so that a second data inputted to said first input/output terminal is outputted as a second input data for said first input/output line, in correspondence with a transition of said clock signal in the second direction.

15 Claims, 14 Drawing Sheets

SEMICONDUCTOR DEVICE TESTABLE ON QUALITY OF MULTIPLE MEMORY CELLS IN PARALLEL AND TESTING METHOD OF THE SAME

BACKGROUND OF THE INVENTION

1. Field of the Invention

The present invention relates to a semiconductor device and a testing method of the same.

2. Description of Related Art

Generally, in manufacturing semiconductor storages a screening test for examining whether memory cells in a semiconductor wafer operate correctly is performed. In this screening test, the IO (input/output) pins of the measuring apparatus are connected in one-to-one correspondence with the IO driver of the semiconductor chip. The measuring apparatus writes in data by way of the IO driver into the memory cell corresponding to the IO driver and reads out the written data. The measuring apparatus, based on the read-out data, determines whether the memory cell is good or not.

Examining whether the memory cells are good or bad, from one cell to another, needs a very long time for a screening test. To reduce the time required for a screening test, a multi-cell test mode for examining whether a plurality of memory cells are good or bad in parallel has been used.

In the multi-cell test mode, data is written into a plurality of IO lines from one DQ terminal of the semiconductor chip. When data is written in this way, the DQ terminal or IO lines are called as being reduced.

In a semiconductor storage, the number of IO lines (the number of lines that are reduced) that are reduced to a single DQ terminal has been determined in accordance with the number of memory cells that can be read out or written in parallel. Specifically, the number of degeneration cannot be set to be equal to or lower than the number of Y switches that can be changed over by a common Y-switch changeover signal. The reason is that if the number of degeneration is set at that number or lower, it becomes impossible to perform individual reading/writing of data into or from each of memory cells into which data is written or from which data is read out, in parallel when a Y-switch is connected by activating a certain Y-switch changeover signal.

The Y-switch herein indicates the switch for changing over connection between the sense amplifier connected to the memory cell and the IO line. Also, usually, IO lines are formed in a pair of complementary IO lines to which two signal lines having a mutually complementary relationship are connected. Accordingly, a Y-switch that switches between one sense amplifier connected to one memory cell and the IO line corresponds to a pair of complementary IO lines.

Now, an example of a semiconductor storage in which a single Y-switch changeover signal is commonly supplied to four sets of Y-switches that connects four sense amplifiers and four pairs of complementary IO lines, or a semiconductor storage which performs data reading/writing in parallel for four memory cells by activating a single Y-switch changeover signal is provided. FIG. 1 is a configurational diagram showing a memory cell array configuration in this semiconductor storage.

In FIG. 1, a single Y-switch changeover switch (e.g., Y-switch changeover switch PYS1) is turned on, complementary signal lines PWRDAT0~3 and PWRDAB0~3 to which data is supplied from four IO lines are connected to sense amplifiers PSA0~3 that correspond to the Y-switches controlled by the Y-switch changeover signal. As a result, a single Y-switch changeover signal causes data supplied from four IO lines to be written into four memory cells in parallel.

FIG. 2 shows a configurational diagram showing a write control circuit for testing whether memory cells in the memory cell array shown in FIG. 1 are good or bad. Here, IO lines PWDA0~PWDA3 in FIG. 2 correspond to four IO lines for supplying data to complementary signal lines PWRDAT0~3 and PWRDAB0~3 in FIG. 1.

In FIG. 2, 16 DQ terminals DQ0~15 are reduced to four IO lines. In testing whether memory cells are good or bad, if the same data is written into all the memory cells form which data is read out and into from which data is written, in parallel, based on activation of one Y-switch changeover signal, and if data is inverted in all the memory cells, then these memory cells are determined to be good by mistake.

Accordingly, the measuring apparatus needs to input data separately to DQ terminals PDQ0~3 so as to write data individually to the four memory cells from which data can be read out and into which data is written, in parallel, based on activation of one Y-switch changeover signal.

In order to input data separately to the memory cells which are readable and writable in parallel based on activation of one Y-switch changeover signal, four IO pins of the measuring apparatus are allotted to this semiconductor storage so that these four IO pins are connected to DQ terminals PDQ0~3. The measuring apparatus reads data from and writes into the memory cells via respective DQ terminals PDQ0~3 so as to test whether the memory cells are good or bad.

FIG. 3 is a timing chart for illustrating the operation of the write control circuit shown in FIG. 2. Herein, it is assumed that DQ terminals PDQ0~3 in FIG. 2 are connected to the measuring apparatus.

When TMD (test mode) signal is activated, the data input to DQ terminals PDQ0~3 are respectively output to IO lines PWDA0~3 corresponding to DQ terminals PDQ0~3 and to the IO lines which are degenerated to DQ lines and correspond thereto. For example, the data input to DQ terminal PDQ0 is output to IO line PWDA0 corresponding to DQ terminal PDQ0, IO line PWDA4 corresponding to DQ terminal PDQ4, IO line PWDA8 corresponding to DQ terminal PDQ8 and IO line PWDA12 corresponding to DQ terminal PDQ12.

The data input to each IO line is latched based on PCLK signal as a clock pulse that is generated in synchronization with the Rise edge (leading edge) of CLK (clock) signal. The data thus latched is input to complementary signal lines PWRDAT0~3 and PWRDAB0~3 when WRT signal that is generated when a write command (writing instruction) is presented as an external command. Then, the input data is written into the memory cells.

The circuit for reading out the written data in memory cells outputs the EXNOR of the data in the memory cells (e.g., the memory cells corresponding to DQ terminals DQ0, DQ4, DQ8 and DQ12) corresponding to the IO lines connected to DQ terminals which have each been reduced. As a result, when all these data are same, the H-level signal is output, otherwise the L-level signal is output. The measuring apparatus determines that the memory cells are good when the H-level signal is output and that the memory cells are bad when the L-level signal is output.

In recent years, in order to further reduce memory cells in size, semiconductor storages in which data is read out from and written into eight memory cells in parallel based on one switch changeover signal, have been in circulation. FIG. 4 is a configurational diagram showing a memory cell array in such a semiconductor storage.

In the above multi-cell measuring test mode, DQ terminals are reduced into the number of the memory cells which are read out and written in based on activation of one Y-switch changeover signal. Accordingly, in the semiconductor storage shown in FIG. 4, DQ terminals are degenerated into eight DQ terminals.

Accordingly, it is necessary to change the number of IO pins allotted to the semiconductor storage depending on the number of memory cells which are read out and written in, in parallel.

Literature 1 (Japanese Patent Application Laid-open 2003-132681) discloses a semiconductor storage in which the same number of IO pins are allotted even though the number of memory cells that are read out and written in parallel based on activation of a Y-switch changeover signal differs.

In this semiconductor storage, when data is read out from or written into four memory cells in parallel based on activation of one Y-switch changeover signal, each data item input through four DQ terminals are expanded four times. When data is read out from or written into eight memory cells in parallel based on activation of one Y-switch changeover signal, each data item input through four DQ terminals are expanded eight times. Accordingly, eight DQ terminals can be reduced to four DQ terminals.

As a result, it is possible to allot the same number of IO pins even though the number of memory cells which are read out from and written in in parallel based on activation of a Y-switch changeover signal differs.

Recently, a further reduction in price of semiconductor storages has been desired. In answer to this demand, it is necessary to reduce the cost of semiconductor storages. It is expected that if the time taken for screening tests can be further shortened, the cost of semiconductor storages can be reduced.

In order to further shorten the time for screening tests, we discovered that it is necessary to further increase the number of memory cells (which will be referred to hereinbelow as multi-measurement number) whose quality can be tested at the same time.

Since if the number of IO pins of the measuring apparatus is increased, the number of semiconductor storages that can be connected to the measuring apparatus at the same time increases, it is possible to increase the multi-measurement number. However, we discovered the problem that, if the number of IO pins of the measuring apparatus increases, the cost for the measuring apparatus increases, hence it is impossible to reduce the cost of the memory.

Further, the method of increasing the number of DQ terminals to be degenerated by expanding each data item input to four DQ terminals eight times, as in the semiconductor storage described in literature 1, can also be considered. However, we discovered that this method entails the problem that it is impossible to write data individually to the memory cells into which data is written or form which data is read out in parallel when one Y-switch changeover signal is activated.

SUMMARY

In one embodiment there is provided a semiconductor device comprising: first and second input/output terminals; a first input/output line connected to said first input/output terminal; a second input/output line connected to said second input/output terminal; and a first by-path route connected between said first input/output line and said second input/output line, wherein when in normal operation mode, said first by-path route is in a non-conductive state, and when in a test mode, said first by-path route is set into a conductive state so that a first data inputted to said first input/output terminal is outputted as a first input data to said second input/output line, in correspondence with a transition of a clock signal in the first direction, and so that a second data inputted to said first input/output terminal is outputted as a second input data for said first input/output line, in correspondence with a transition of said clock signal in the second direction.

In another embodiment, there provided a semiconductor device comprising: an internal circuit having a test operation mode; and a plurality of data input/output terminals connected to the internal circuit; wherein the internal circuit receives a first number of test data from a second number of terminals of the data input/output terminals when the internal circuit is in the test mode, each of the test data is changed independently from other test data and the second number is smaller than the first number.

In another embodiment, there provided a method testing a semiconductor device including a plurality of memory cells, a plurality of input/output terminals and a plurality of input/output lines each connected to an associated one of the input/output terminals, said method comprising: inputting a first test data pattern to ones of the memory cells through a part of input/output terminals; inputting a second test data pattern to other ones of the memory cells through the part of input/output terminals; wherein the first test data pattern is changed independently from the second test data pattern and the part of input/output terminals are smaller in number than the input/output lines.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
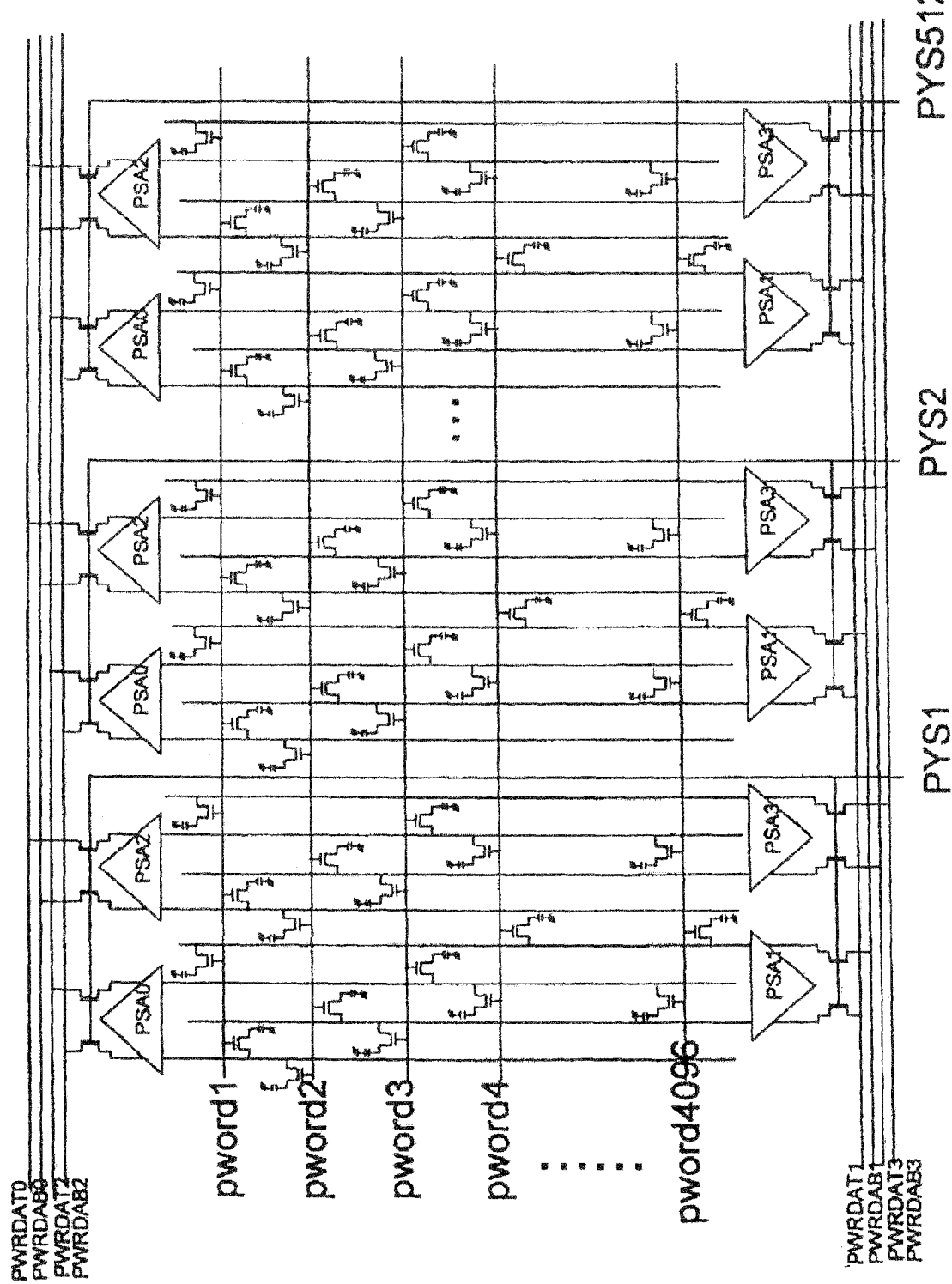
FIG. 1 is a configurational diagram showing a memory cell array in which data is read out from and written into four memory cells in parallel based on one switch changeover signal.
Figure 2:
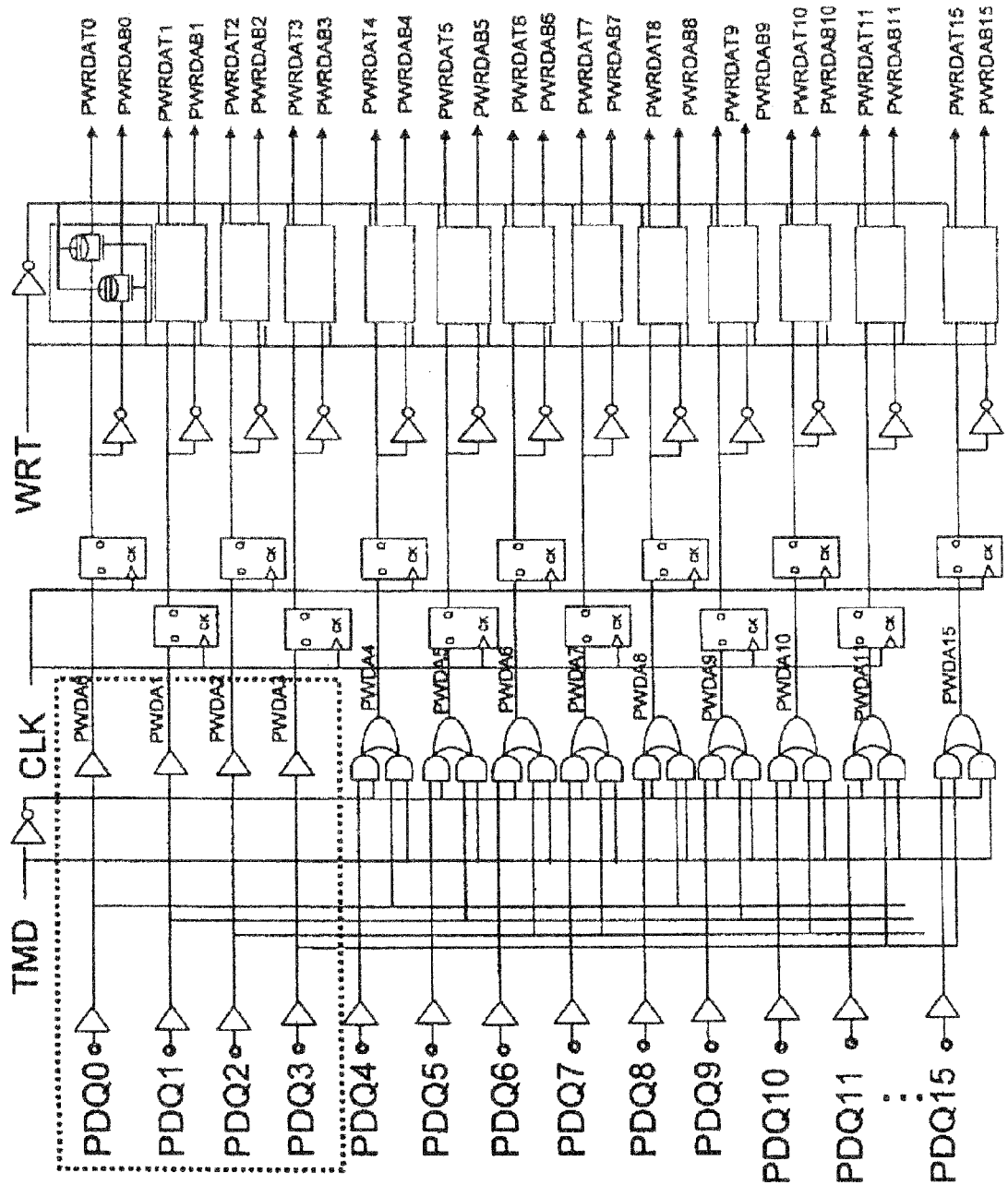
FIG. 2 is a configurational diagram showing a write control circuit for testing whether memory cells in a memory cell array are good or bad.
Figure 3:
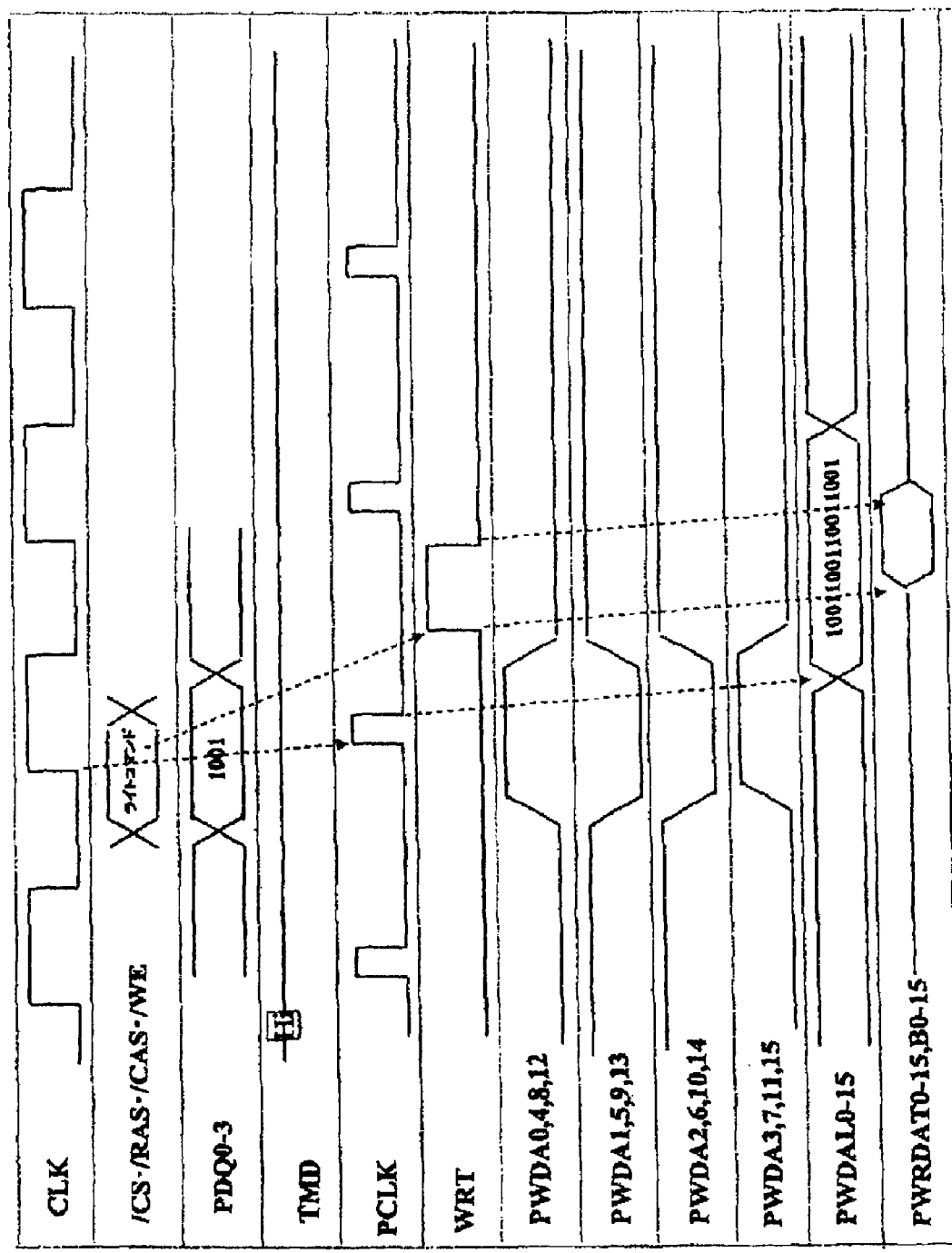
FIG. 3 is a timing chart for illustrating the operation of a write control circuit.
Figure 4:
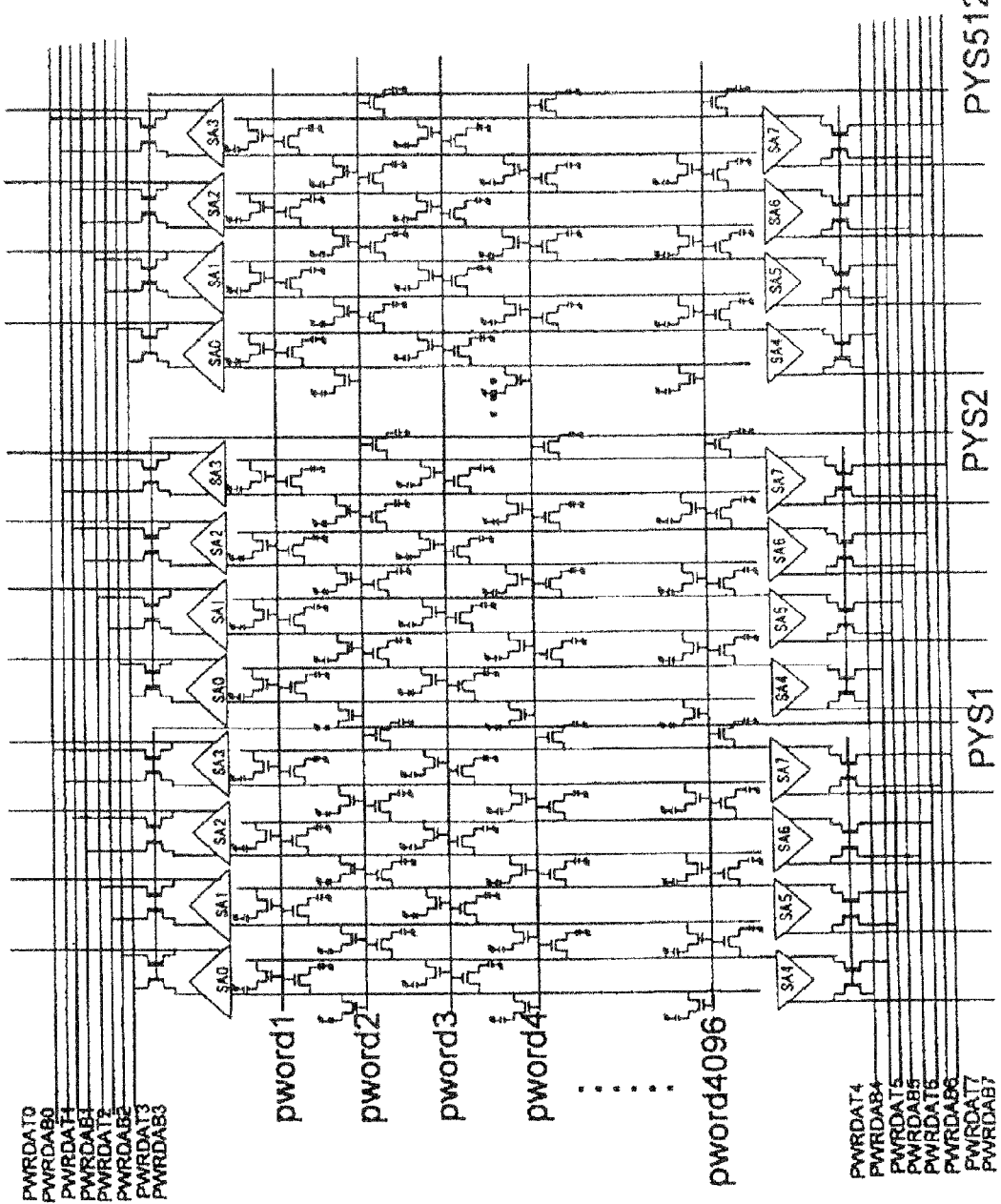
FIG. 4 is a configurational diagram showing a memory cell array with which data is read out from and written into eight memory cells in parallel based on one switch changeover signal.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The embodiments will be described with reference to the drawings. In each drawing, those having the same functions are allotted with the same reference numerals, so that their description may be omitted.

Figure 5:
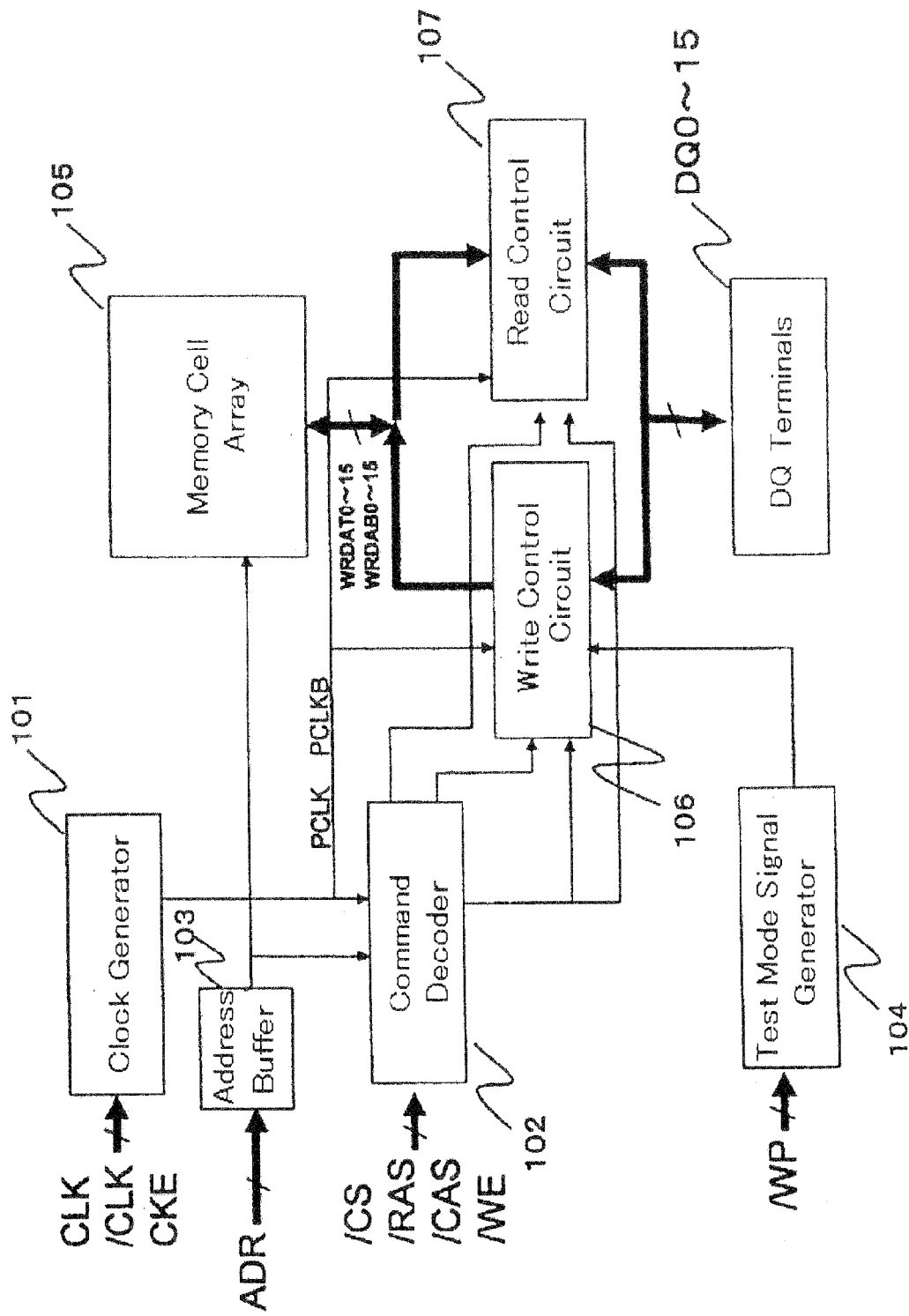
FIG. 5 is a block diagram showing a semiconductor storage configuration of the first embodiment.

FIG. 5 is a block diagram showing a semiconductor storage configuration of the first embodiment of the present invention. Referring now to FIG. 5, the semiconductor storage according to a first embodiment of the present invention includes DQ terminals DQ0~15, clock generator 101, command decoder 102, address buffer 103, test mode signal generator 104, memory cell array 105, write control circuit 106 and read control circuit 107. The semiconductor storage is connectable to a measuring apparatus (not shown) for testing whether memory cells in memory cell array 105 are good or not.

DQ terminals DQ0~15 are input/output terminals to which data is input from the measuring apparatus. DQ terminals DQ0~15 are connectable to the IO pins of the measuring apparatus.

When data is input from the measuring apparatus, the data is supplied to write control circuit 106 via DQ terminals DQ0~15. Specifically, data is supplied to IO lines (input/output lines), in the write control circuit, connected to DQ terminals DQ0~15. Specific explanation of IO lines will be described later.

Clock generator 101 is an example of a generating circuit. Clock generator 101 receives a CLK (clock) signal and a CKE (clock enable) signal from the measuring apparatus via its clock terminal Clock generator 101, when receiving a CKE signal, generates a PCLK signal and a PCLKB signal, which are clock pulses different in phase from each other, in synchronization with the rising edge (leading edge) and Fall edge (trailing edge) of the CLK signal that is input after reception of the CKE signal. As a CLK signal, either a positive-phase CLK signal (CK signal) or a negative-phase CLK signal (/CK signal) may be used.

It is assumed hereinbelow that a PCLK signal is generated in synchronization with the rising edge of CK signal and that PCLKB signal is generated in synchronization with the failing edge of CK signal. Additionally, PCLK signal is one example of the first pulse signal and PCLKB signal is one example of the second pulse signal.

Further, the rising edge of CLK signal is a transition of a CLK signal in the first direction and the falling edge of CLK signal is a transition of a CLK signal in the second direction. Here, it is also possible that the rising edge of a CLK signal is a transition of a CLK signal in the second direction and the falling edge of a CLK signal is a transition of CLK signal in the first direction.

Command decoder 102 receives external commands from the measuring apparatus via its command terminal. Examples of external commands include /CS (chip select) signal, /RAS (row-address strobe) signal, /CAS (column-address strobe) signal and /WE (write enable) signal.

Command decoder 102 generates WRT (write) signal when an external command for writing into memory cells (write command) is given.

Address buffer 103 receives a ADR (address) signal from the measuring apparatus via its address terminal. Address buffer 103 generates address data based on the input ADR signal.

Test mode signal generator 104 activates a TMD signal and a TMDULT signal, which are test mode signals representing the test mode for testing whether memory cells are good or bad. For example, test mode signal generator 104, when receiving /WP (operation prohibition) signal from the measuring apparatus via its test mode terminal, activate a TMD signal and a TMDULT signal. Here, when a TMD signal and a TMDULT signal are not activated, the semiconductor storage is set into the normal operation mode for performing a normal operation.

Memory cell array 105 includes a plurality of memory cells including a plurality of memory elements. Here, a memory element can store one-bit data. Further, memory cell array 105 includes a plurality of memory blocks composed of a plurality of memory cells.

Figure 6:
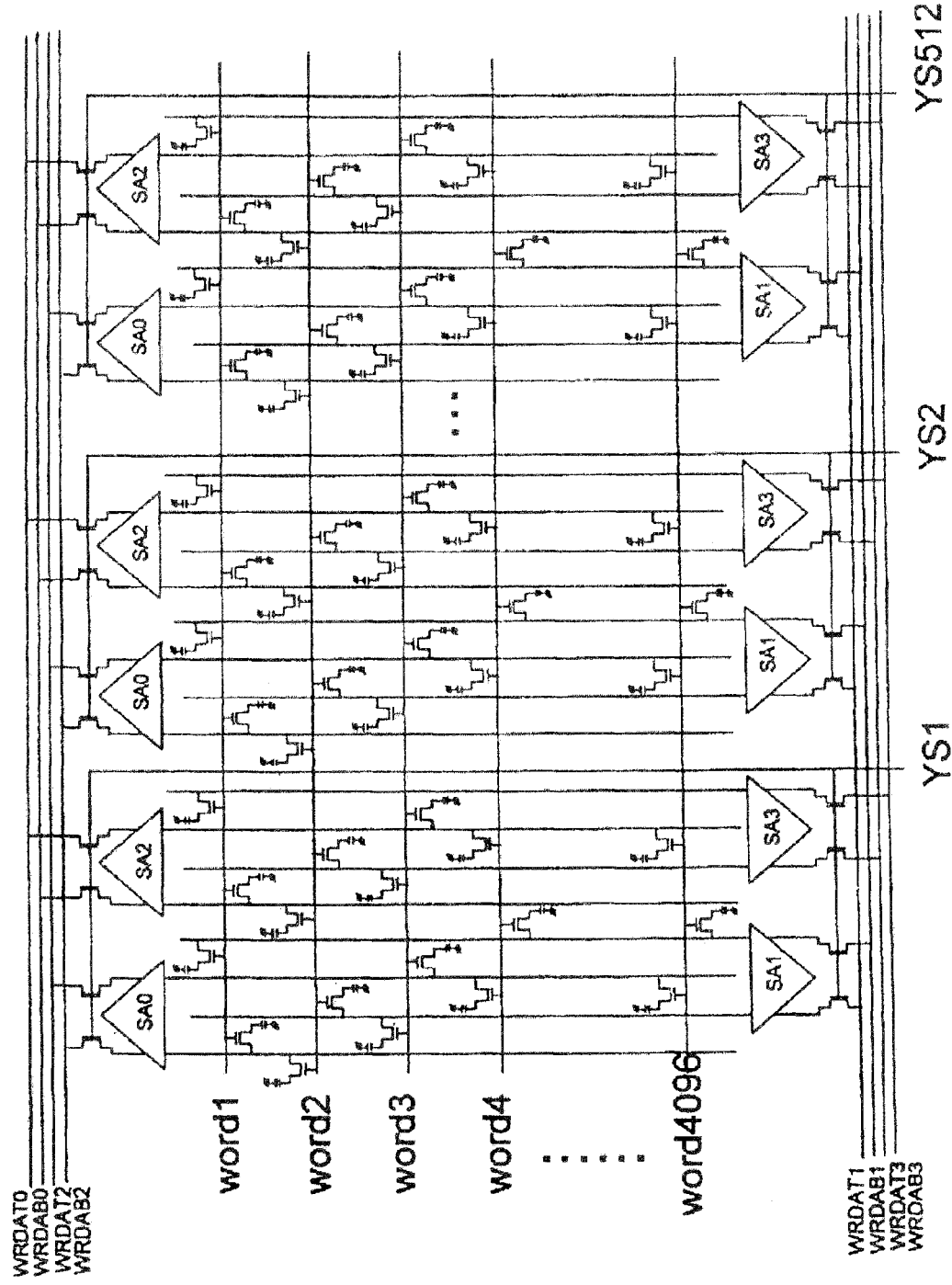
FIG. 6 is a configurational diagram showing one example of a memory cell array.

FIG. 6 is a configurational diagram showing memory cell array 105.

Specifically, this is a configurational diagram showing one memory block in memory cell array 105.

In FIG. 6, memory cell array 105 includes plural pairs of complementary Y-switches, controlled by Y-switch changeover signals YS1~YS512. Here a pair of complementary Y-switches are two Y-switches for connecting between one pair of complementary signal lines corresponding to one sense amplifier and one pair of complementary IO lines. Further, one Y-switch changeover signal is commonly input to a predetermined number, 2 or greater, of complementary Y-switch pairs. With this arrangement, it becomes possible to connect the predetermined number of sense amplifiers with the predetermined number of complementary IO line pairs by activation of one Y-switch changeover signal, whereby it is possible to perform parallel writing or reading of the predetermined number of memory cells by activation of one Y-switch changeover signal. In the present embodiment, the predetermined number is four. That is, it is possible to perform parallel writing or reading of four memory cells by activation of one Y-switch changeover signal. This predetermined number is one example of the first number.

For example, when each of Y-switch changeover signals YS1~YS512 is activated, sense amplifiers SA0~SA3, corresponding to the predetermined number "4" of activated Y-switches to which the Y-switch changeover signal is supplied are connected to complementary signal lines WRDAT0~WRDAT3 and WRDAB0~WRDAB3, respectively. Here, complementary signal lines WRDAT0~WRDAT3 and WRDAB0~WRDAB3, transfer the data output from the IO lines that correspond to the Y-switches to which the Y-switch changeover signal is supplied.

As a result, the data output from the IO line is written into each memory cell

Here, activation/deactivation of Y-switch changeover signals YS1~YS512 and activation of word lines word 1 to word 4096 are performed by an unillustrated address construction circuit, based on the address data generated by address buffer 103.

Returning to FIG. 5, write control circuit 106 controls data writing to each memory cell in memory cell array 105.

Figure 7:
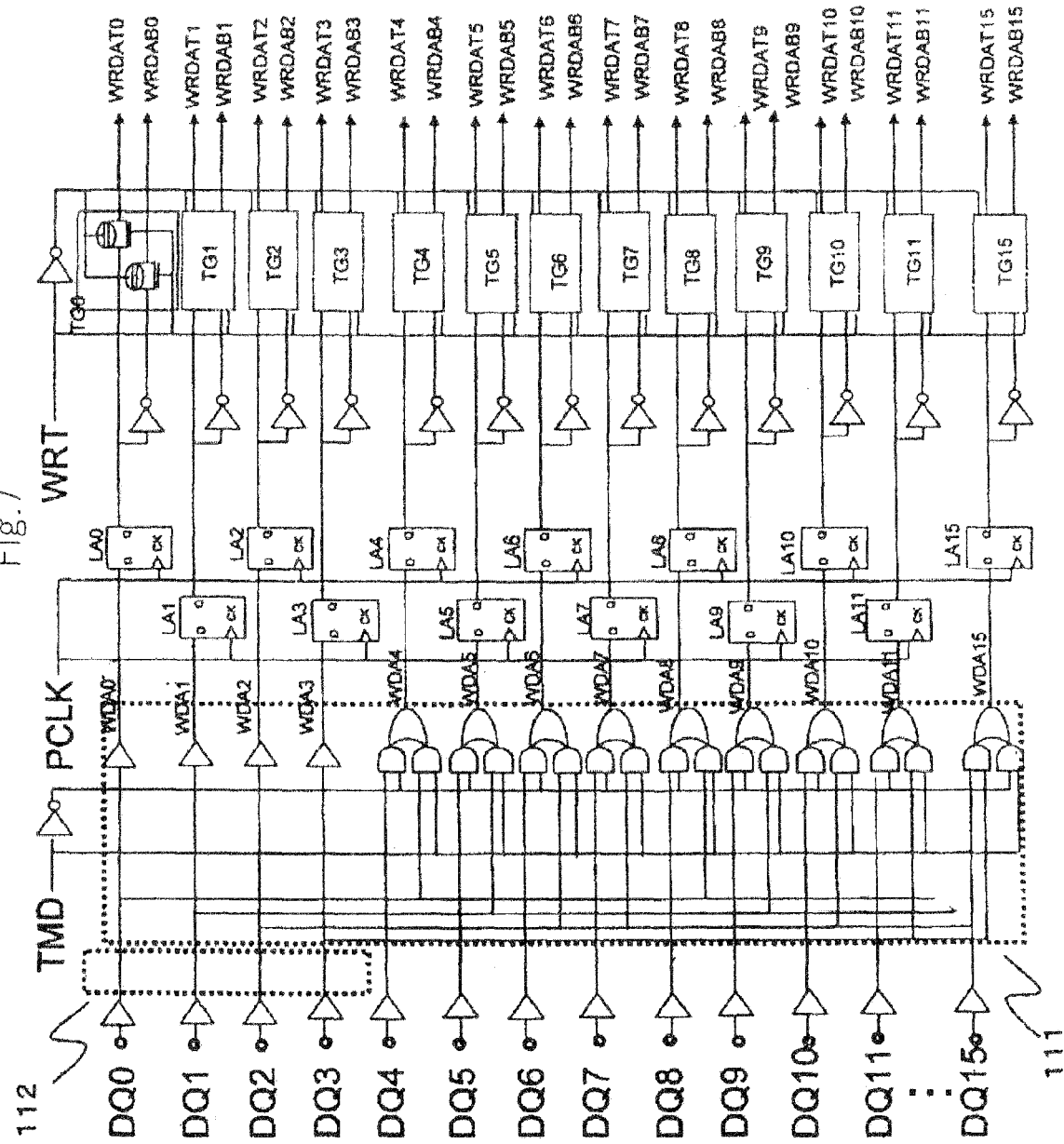
FIG. 7 is a configurational diagram showing one example of a write control circuit.

FIG. 7 is a configurational diagram showing write control circuit 106.

Write control circuit 106 includes IO lines WDA0~WDA15.

IO lines WDA0~WDA15 are connected to DQ terminals DQ0~15, respectively. External input of write data is supplied to each of IO lines WDA0~WDA15 via DQ terminals connected thereto.

Further, IO lines WDA0~WDA15 are formed with latch circuits LA0~LA15 and transfer gates TG0~TG15, respectively.

Each CK terminal of latch circuits LA0~LA15 is supplied with PCLK signal generated at clock generator 101. When write data is input to IO lines WDA0~WDA15, latch circuits LA0~LA15 latch the write data in synchronization with clock pulse PCLKB input to the CK terminals.

As a result, latch circuits LA0~LA15 each latch the data input to DQ terminals DQ0 and DQ2, in correspondence with the transition of CLK signal in the second direction.

Input to the control terminals of transfer gates TG0~TG15 is the WRT signal generated at command decoder 102. When receiving the WRT signal, transfer gates TG0~TG15 output the write data latched by latch circuits LA0~LA15 to complementary signal lines WRDAT0~WRDAT15, respectively, and to complementary signal lines WRDAB0~WRDAB15, respectively.

The memory cell array shown in FIG. 6 is represented by the memory block corresponding to complementary signal lines WRDAT0~WRDAT3 (complementary signal lines WRDAB0~WRDAB3), among complementary signal lines WRDAT0~WRDAT15 (complementary signal lines WRDAB0~WRDAB15). The memory blocks corresponding to complementary signal lines WRDAT4~WRDAT7 (complementary signal lines WRDAB4~WRDAB7), complementary signal lines WRDAT8~WRDAT11 (complementary signal lines WRDAB8~WRDAB11) and complementary signal lines WRDAT12~WRDAT15 (complementary signal lines WRDAB12~WRDAB15), respectively, have the same configurations as that shown in FIG. 6.

The Y-switch changeover signals included in the memory block shown in FIG. 6 serve as the predetermined Y-switch changeover signals. The transfer paths including IO lines WRDAT0~3 corresponding to the Y switches to which the Y-switch changeover signal is supplied serve as the predetermined transfer paths.

Input to degeneration circuit 111 is the TMD signal activated by test mode signal generator 104. Degeneration circuit 111, in accordance with the TMD signal, switches the data to be supplied to IO lines WDA4~WDA15, between the data input through IO lines WDA0~WDA3 and the data input through DQ terminals DQ4~15.

Specifically, when the TMD signal in its active state is being input, degeneration circuit 111 supplies each item of write data externally input to IO lines WDA0~3, to the predetermined three IO lines, respectively, other than IO lines WDA0~3. More specifically, degeneration circuit 111 supplies the write data input externally to IO line WDAn to IO lines WDAn+4, WDAn+8 and WDAn+12. Here, n is an integer from 0 to 3.

On the other hand, when no TMD signal is input, degeneration circuit 111 directly outputs the data input through DQ terminals DQ4~DQ15 as write data to IO lines WDA4~WDA15, respectively.

As a result, degeneration circuit 111 can degenerate DQ terminals DQ0~DQ15 into four DQ terminals when in test mode.

By-path circuit 112 reduces four DQ terminals DQ0~DQ3 that are not degenerated from each other by degeneration circuit 111, to two DQ terminals.

Figure 8:
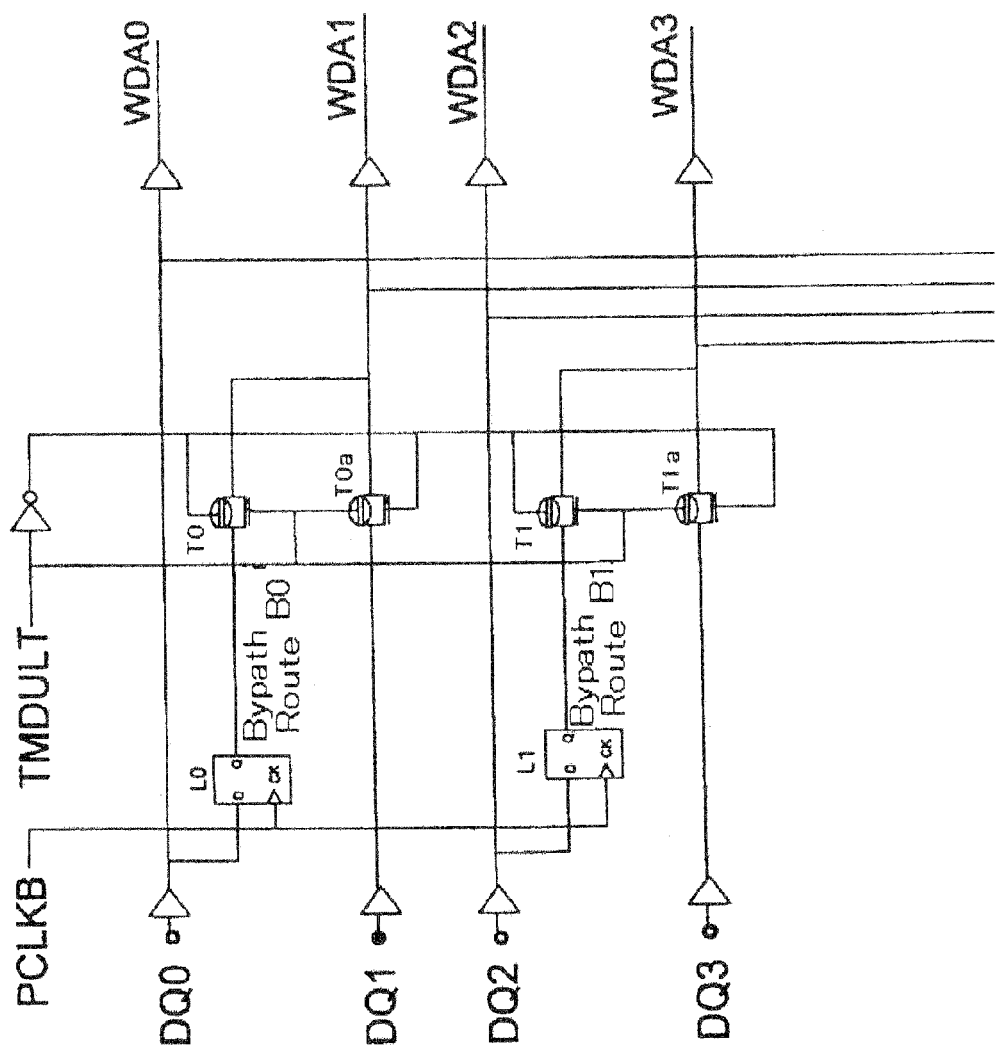
FIG. 8 is a configurational diagram showing one example of a by-path circuit.

FIG. 8 is a configurational diagram showing by-path circuit 112.

In FIG. 8, by-path circuit 112 includes by-path route B0 that connects between IO lines WDA0 and WDA1 and by-path route B1 that connects between IO lines WDA2 and WDA3. By-path routes B0 and B1 include latch circuits L0 and L1, respectively, and transfer gates T0 and T1, respectively.

Further, transfer gate T0a is provided on the route connecting DQ terminal DQ1 and IO line WDA1 and transfer gate T1a is provided on the route connecting DQ terminal DQ3 and IO line WDA3.

The CK terminals of latch circuits L0 and L1 are supplied with the PCLKB signal generated at clock generator 101. Latch circuits L0 and L1 latch the data input to DQ terminals DQ0 and 2 as the data for IO line WDA1 and IO line WDA3, respectively, in synchronization with PCLKB signal.

As a result, the data input to DQ terminals DQ0 and 2 can be latched as the data for IO line WDA1 and IO line WDA3, respectively, in correspondence with the transition of a CLK signal in the first direction.

The TMDULT signal generated at test mode signal generator 104 is input to each of the control terminals of transfer gates T0, T1, T0a and T1a.

When the TMDULT signal is in the active state, transfer gates T0 and T1 are in the conductive state and transfer gates T0a and T1a are in the non-conductive state. On the other hand, when the TMDULT signal is in the inactive state, transfer gates T0 and T1 are in the non-conductive state and transfer gates T0a and T1a are in the conductive state.

As a result, when a TMDULT signal is active, the data latched by latch circuits L0 and L1 are supplied to IO lines WDA1 and WDA3, respectively, whereas, when the TMDULT signal is inactive, the data input to DQ terminals DQ1 and DQ3 are supplied to IO lines WDA1 and WDA3, respectively.

Accordingly, when in normal operation mode, by-path routes B0 and B1 are set into non-conductive states. When in test mode, by-path routes B0 and B1 are set into non-conductive states while the data input to DQ terminals DQ0 and DQ2 are latched as the input data to DQ terminals DQ1 and DQ3, in correspondence with the transition of a CLK signal in the first direction.

Returning to FIG. 5, read control circuit 107 reads out data written in each memory cell, and outputs the read-out data to the measuring apparatus via DQ0~DQ15. Here, since read control circuit 107 is not directly related to the present invention and is obvious to those skilled in the art, its detailed description is omitted.

Next, the operation will be described.

Figure 9:
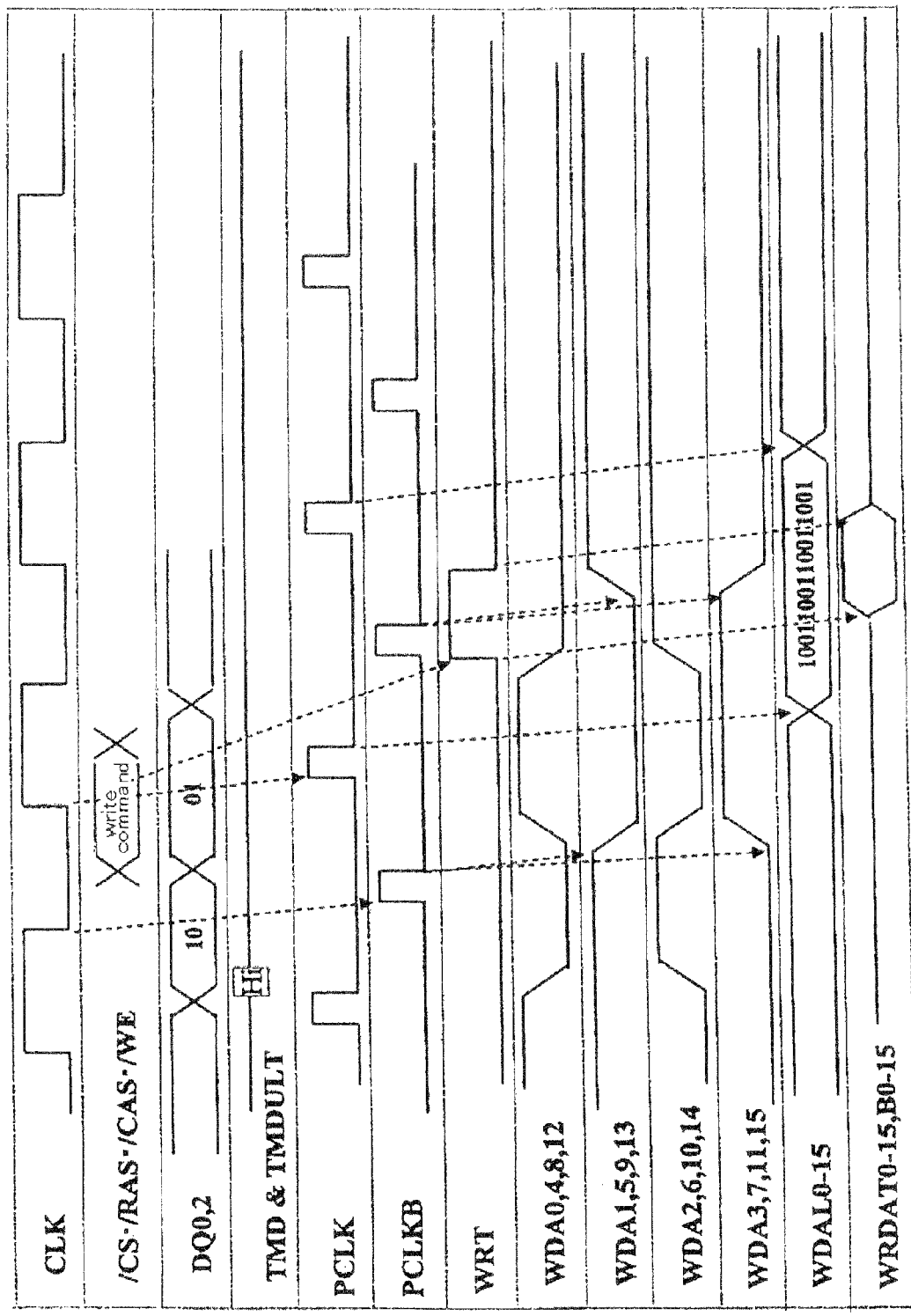
FIG. 9 is a timing chart for illustrating the operation of a semiconductor storage of the first embodiment.

FIG. 9 is a timing chart for illustrating the operation of the semiconductor storage of the present embodiment. Here, it is assumed that IO pins of the measuring apparatus are connected to DQ0 and DQ2. It is also assumed that the measuring apparatus inputs a CLK signal, external commands, a ADL signal and a /WP signal to the semiconductor storage. It is also assumed that a TMD signal and a TMDULT signal are set in the active state.

To begin with, the measuring apparatus, in synchronization with the falling edge of the CLK signal before input of a control command representing a write command, inputs data for DQ terminals DQ1 and DQ3, to DQ terminals DQ0 and DQ2.

The input data are each latched by latch circuits L0 and L1, respectively, based on the PCLKB signal that was generated in synchronization with the falling edge of the CLK signal. The latched data are each output as write data from transfer gates T0 and T1 to IO lines WDA1 and WDA3, respectively. The latched data are each supplied by degeneration circuit 111, respectively, to the IO lines that correspond to the DQ terminals that are degenerated to DQ terminals DQ1 and DQ3.

Thereafter, the measuring apparatus inputs a control command representing a write command, in synchronization with the rising edge of the next CLK signal and inputs data for DQ terminals DQ0 and DQ2 to DQ terminals DQ0 and DQ2. These input data are supplied as write data to IO lines WDA0 and WDA2, respectively.

The write data supplied by degeneration circuit 111 to the aforementioned IO lines WDA0~WDA3 are also supplied to IO lines WDA4~15, respectively.

Thereafter, the data input to IO lines DWA0~15 are latched by latch circuits LA0 and LA15, based on the PCLK signal which clock generator 101 generated in synchronization with the rising edge of the CLK signal.

Then, when the WRT signal, generated in accordance with the write command is input to transfer gates TG0~TG15, the data items latched by latch circuits LA0 and LA 15, are each output to memory cell array 105 from transfer gates TG0~TG15, respectively, via complementary signal lines PWRDAT0~3 and PWRDAB0~3. The output write data items are each written into individual memory cells.

Next, the effect will be described.

In the present embodiment, clock generator 101 generates a PCLK signal and a PCLKB signal, respectively, in synchronization with the leading edge and falling edge of the CLK signal of the measuring apparatus. When write data is input, each of the IO lines WDA0 to WDA15 latches the write data based on a PCLK signal and outputs the latched write data. The Y-switches to which Y-switch changeover signals YS1~YS512 are supplied, write the write data output from the IO lines corresponding to themselves into memory cells, in parallel. By-path route B0 latches the data that is input to DQ terminal DQ0 based on the PCLKB signal, and supplies the latched data as write data to IO line WDA1.

In this case, the data input to DQ terminal DQ0 is supplied as write data to IO line WDA0. Further, the data input to DQ terminal DQ0 is latched at the failing edge of the CLK signal, and the latched data is supplied as write data to IO line WDA1. Then the write data is latched at the rising edge of the CLK signal, and the latched data is written into the memory cell, in parallel.

Accordingly, when, for example, the first data is input to DQ terminals DQ0 and 2 in time with the falling edge of a CLK signal, then the second item at data is input to DQ terminals DQ0 and 2 before the rising edge of the next CLK signal, and it becomes possible to write data individually into four memory cells which data is written into or read out from, in parallel through two DQ terminals based on activation of one Y-switch changeover signal. As a result, even when the IO lines are reduced to a smaller number than the number of memory cells into which data can be written or form which data can be read out, in parallel based on activation of one Y-switch changeover signal, it is possible to write data individually into memory cells into which data is written or from which data is read out, in parallel, based on activation of one Y-switch changeover signal and reduce the cost.

Further, in the present embodiment, when in test mode, by-path route B0 is set into the conductive state, and the data input to DQ terminal DQ0 is latched as the input data to DQ terminal DQ1 in correspondence with the transition of a CLK signal in the first direction and is latched as the input data to DQ terminal DQ0 in correspondence with the transition of the CLK signal in the second direction.

Accordingly, when, for example, the first data (input data to IO line WD1) is input to DQ terminal DQ0 in time with a next of a CLK signal in the first direction, then the second data (input data to IO line WDA0) is input to DQ terminal DQ0 before the transition of the next CLK signal in the second direction, and it becomes possible to write two pieces of data among the data to be written individually into four memory cells into which data is written or from which data is read out, in parallel, based on activation of one Y-switch changeover signal. As a result, even when IO lines are reduced to a smaller number than the number of memory cells into which data is written or from which data is read out, in parallel, based on activation of one Y-switch changeover signal, it is possible to write data individually to memory cells into which data can be written or from which data can be read out, in parallel, based on activation of one Y-switch changeover signal, and reduce the cost.

Next, the second embodiment will be described. This embodiment will be presented mainly by illustrating the functions and operations that are different from the first embodiment.

Figure 10:
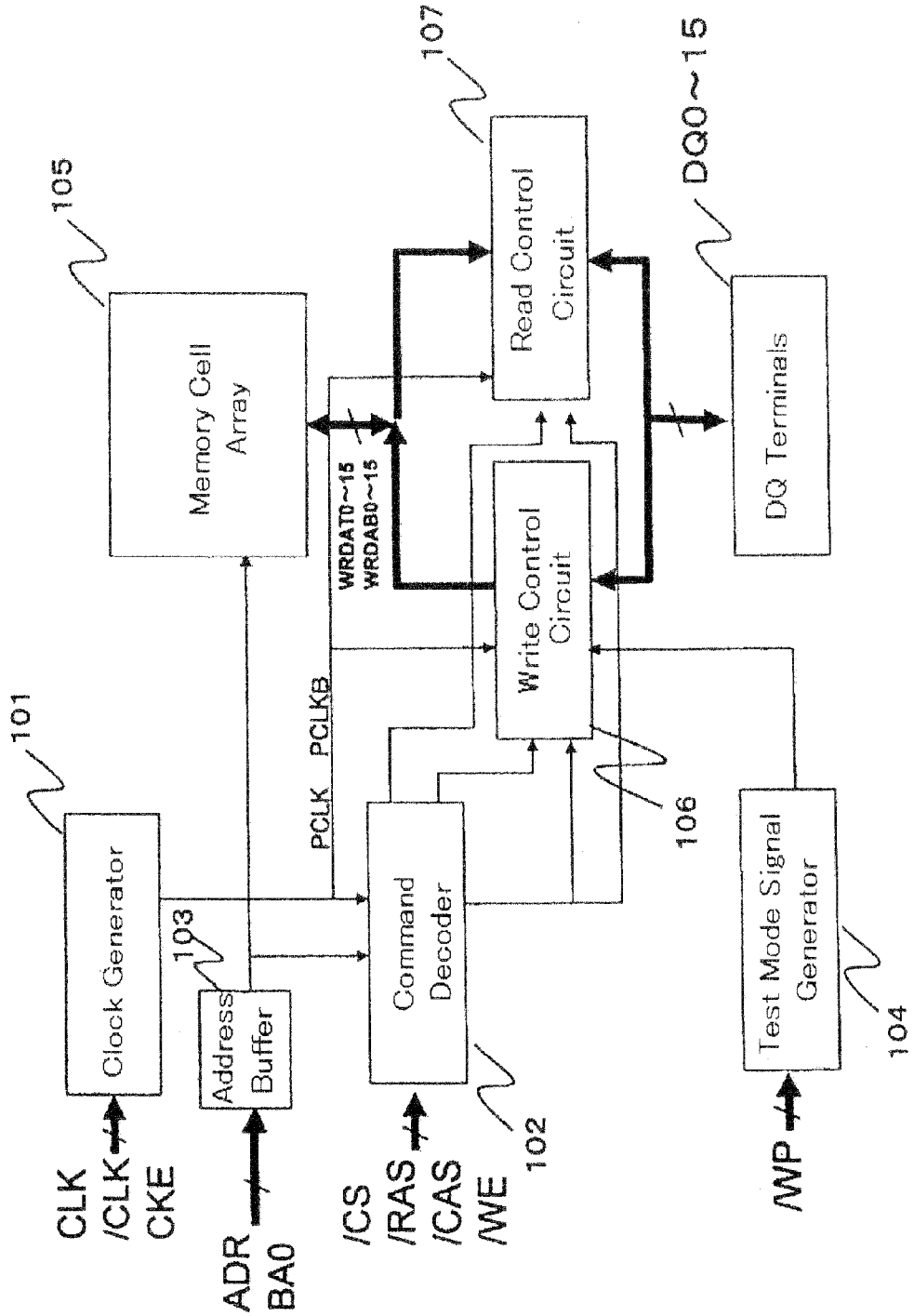
FIG. 10 is a block diagram showing the configuration of a semiconductor storage of the second embodiment.

FIG. 10 is a block diagram showing the configuration of a semiconductor storage of the second embodiment of the present invention.

In FIG. 10, a BA0 (bank address) signal is also input to address buffer 103 via a bank address terminal, from the measuring apparatus. Address buffer 103, when receiving BA0 signal, generates a TBA0 (transformed bank address) signal based on the BA0 signal. Then, address buffer 103 generates a logical NOT of the TBA0 signal, as an external input signal corresponding to the BA0 signal.

Here, address buffer 103 is one example of a structuring circuit. BA0 signal is one example of a predetermined external signal.

Further, since, in the prior art, a BA0 signal is not used in testing whether memory cells are good or bad, the bank address terminal is not used. Accordingly, if a BA0 signal is used as an external signal, it is not necessary to provide a new terminal for receiving external signals. Though the external signal may be an arbitrary signal, it is preferred that it be a signal that does not need to have a new terminal. as BA0 signal.

Figure 11:
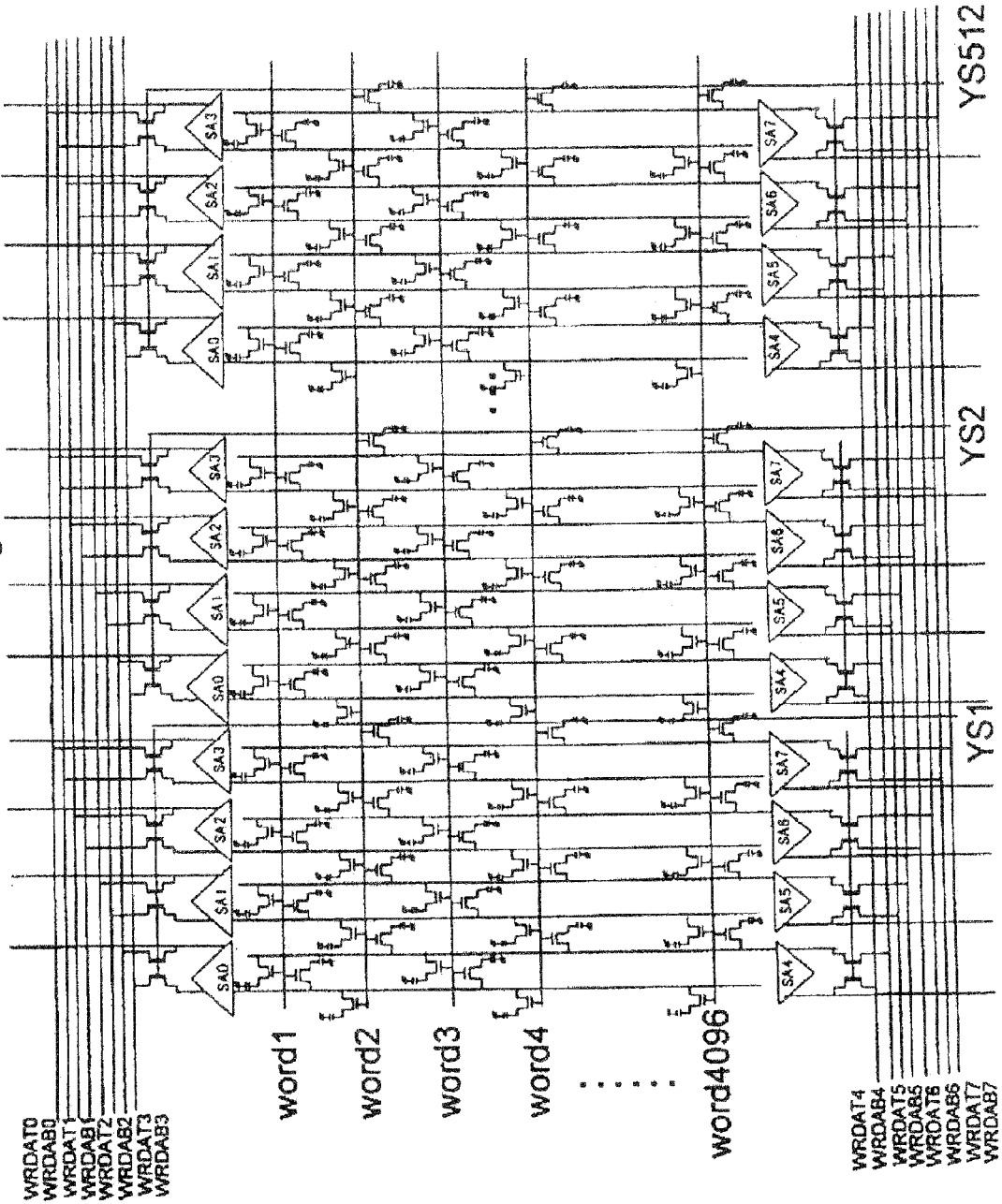
FIG. 11 is a configurational diagram showing another example of a memory cell array.

FIG. 11 is a configurational diagram showing memory cell array 105 of the present embodiment. Specifically, this is a configurational diagram showing one memory block in memory cell array 105.

In FIG. 11, the predetermined number is 8. More explicitly, each of Y-switch changeover signals YS1~YS512 is previously associated with the predetermined number of "8" memory cells, and the predetermined number of "8" complementary IO line pairs. Further, eight sense amplifiers SA0~7 are provided for every Y-switch pair to which a common Y-switch changeover signal is supplied, so as to read and write data for eight memory cells in parallel based on activation of one Y-switch changeover signal.

For example, when any of Y-switch changeover signals YS1~YS512 is activated, the Y-switch pair to which the activated Y-switch changeover signal is supplied, is turned on. As a result, sense amplifiers SA0~SA7 corresponding to the Y-switch pair are connected to complementary signal lines WRDAT0~WRDAT7 and to WARDAB0~WARDAB7, respectively, to thereby write data output from the eight IO lines, in parallel, into associated memory cells.

Here, the memory cells corresponding to complementary signal lines WRDAT8~WRDAT15 and to WARDAB8~WARDAB15 have the same configurations as in FIG. 11.

Figure 12:
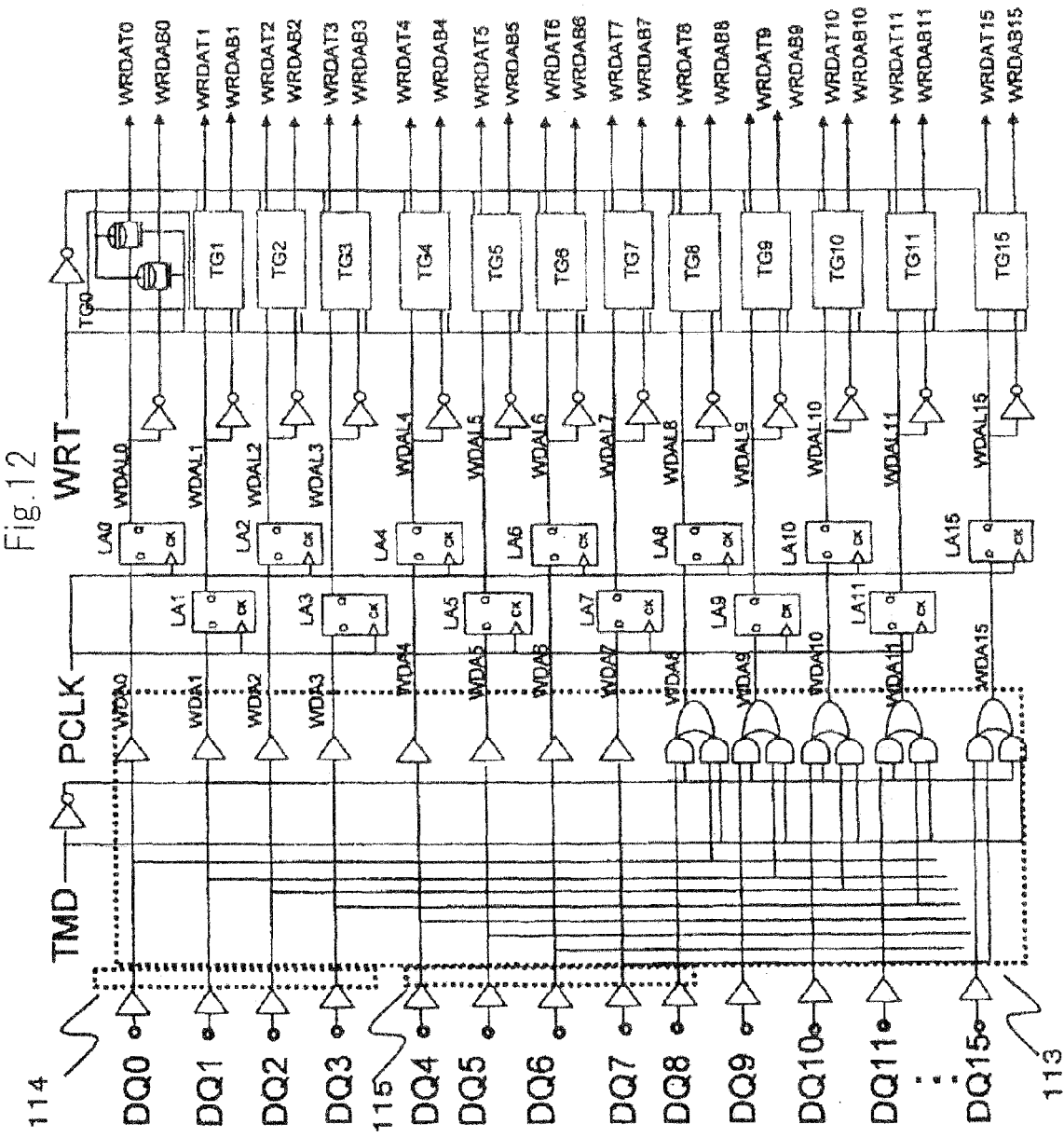
FIG. 12 is a configurational diagram showing another example of a write control circuit.

FIG. 12 is a configurational diagram showing write control circuit 106 of the present embodiment.

Input to degeneration circuit 113 is the TMD signal activated by test mode signal generator 104. Degeneration circuit 113, in accordance with the TMD signal, switches the data to be supplied to IO lines WDA8~WDA15, between the data input through IO lines WDA0~7 and the data input through DQ terminals DQ8~15.

Specifically, when a TMD signal in its active state is being input, degeneration circuit 113 supplies each of the write data externally input to IO lines WDA0~7, to the predetermined one IO line in addition to IO lines WDA0~7. More specifically, degeneration circuit 113 supplies the write data input externally to IO line WDAn to IO lines WDAn+8, too. Here, n is an integer from 0 to 7.

On the other hand, when no TMD signal is input, or when TMD signal in its non-active state is input, degeneration circuit 113 outputs the data input through DQ terminals DQ4~DQ15 as write data to IO lines WDA4~WDA15, respectively.

As a result, degeneration circuit 113 can reduce DQ terminals DQ0~DQ15 into eight DQ terminals when in test mode.

By-path circuit 114 degenerates eight DQ terminals DQ0~DQ7 that are not degenerated from each other by degeneration circuit 113, to two DQ terminals.

Figure 13:
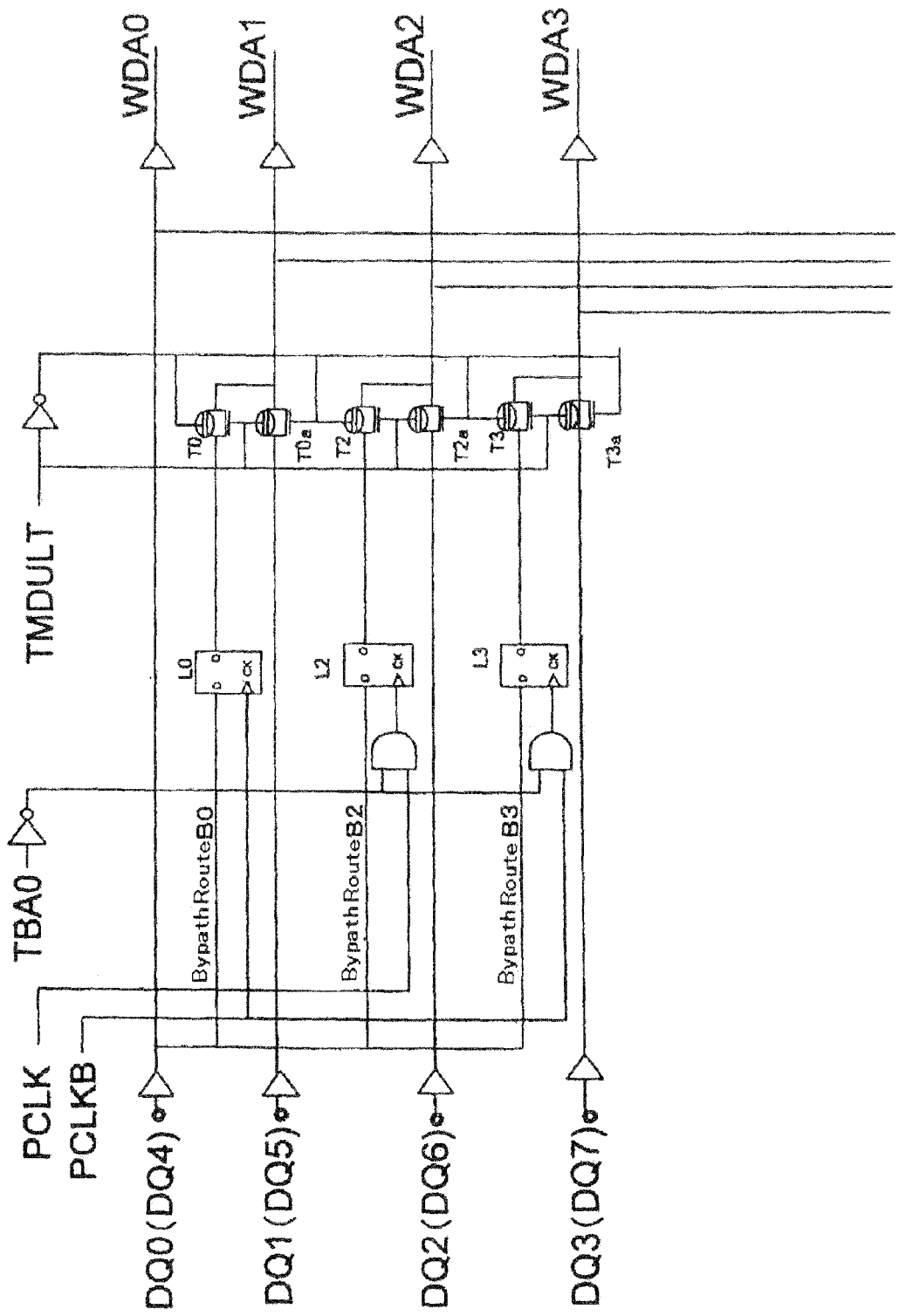
FIG. 13 is a configuration diagram showing another example of a by-path circuit; and, FIG. 14 is a timing chart for illustrating the operation of a semiconductor storage of the second embodiment.

FIG. 13 is a configurational diagram showing by-path circuits 114 and 115. Description hereinbelow will be given by referring to an example of by-path circuit 114 while description of by-path circuit 115 is omitted. Description of by-path circuit 115 is equivalent to that of by-path circuit 114 hereinbelow when DQ terminals DQ0~3 are replaced by DQ terminals DQ4~7, respectively and IO lines WDA0~3 are replaced by IO lines WDA4~7, respectively.

In FIG. 13, by-path circuit 114 connects by-path route B0, with by-path route B2 that connects IO lines WDA0 and WDA2, and with by-path route B3 that connects IO lines WDA0 and WDA3. by-path routes B2 and B3 include latch circuits L2 and L3, respectively, and transfer gates T0 and T1, respectively.

Further, transfer gate T0a is provided on the route connecting DQ terminal DQ1 and IO line WDA1, transfer gate T2a is provided on the route connecting DQ terminal DQ2 and IO line WDA2, and transfer gate T3a is provided on the route connecting DQ terminal DQ3 and IO line WDA3.

The CK terminal of latch circuit L2 is supplied with a signal that represents a logical product between the PCLK signal generated at clock generator 101 and the TBA0 signal generated at address buffer 103. Latch circuit L2 latches the data input to DQ terminals DQ0 in synchronization with the signal that represents the logical product between the PCLK signal and the TBA0 signal.

The CK terminal of latch circuit L3 is supplied with a signal that represents a logical product between the PCLKB signal generated at clock generator 101 and the TBA0 signal generated at address buffer 103. Latch circuit L3 latches the data input to DQ terminals DQ0 in synchronization with the signal that represents the logical product between the PCLKB signal and the TBA0 signal.

As a result, the timings of the transitions in the first direction at which the data for IO lines WDA0 and WDA2 are latched at latch circuits L0 and L2 become different from each other, and the timings of the transitions in the second direction at which the data for IO lines WDA1 and WDA3 are latched at latch circuits L0 and L3 become different from each other. The timings of the transitions in the first direction and the timings of the transitions in the second direction are controlled by the BA0 signal for generating TBA0 signal.

The TMDULT signal generated at test mode signal generator 104 is input to each of the control terminals of transfer gates T2, T3, T2a and T3a.

When the TMDULT signal is in the active state, transfer gates T2 and T3 are in the conductive state and transfer gates T2a and T3a are in the non-conductive state. On the other hand, when TMDULT signal is in the inactive state, transfer gates T2 and T3 are in the non-conductive state and transfer gates T2a and T3a are in the conductive state.

As a result, when the TMDULT signal is in the active state, the data latched by latch circuits L0, L2 and L3 are supplied to IO lines WDA1 through WDA3, respectively, whereas, when the TMDULT signal is in the inactive state, the data input to DQ terminals DQ1 through DQ3 are supplied to IO lines WDA1 through WDA3, respectively.

Next, the operation will be described.

Figure 14:
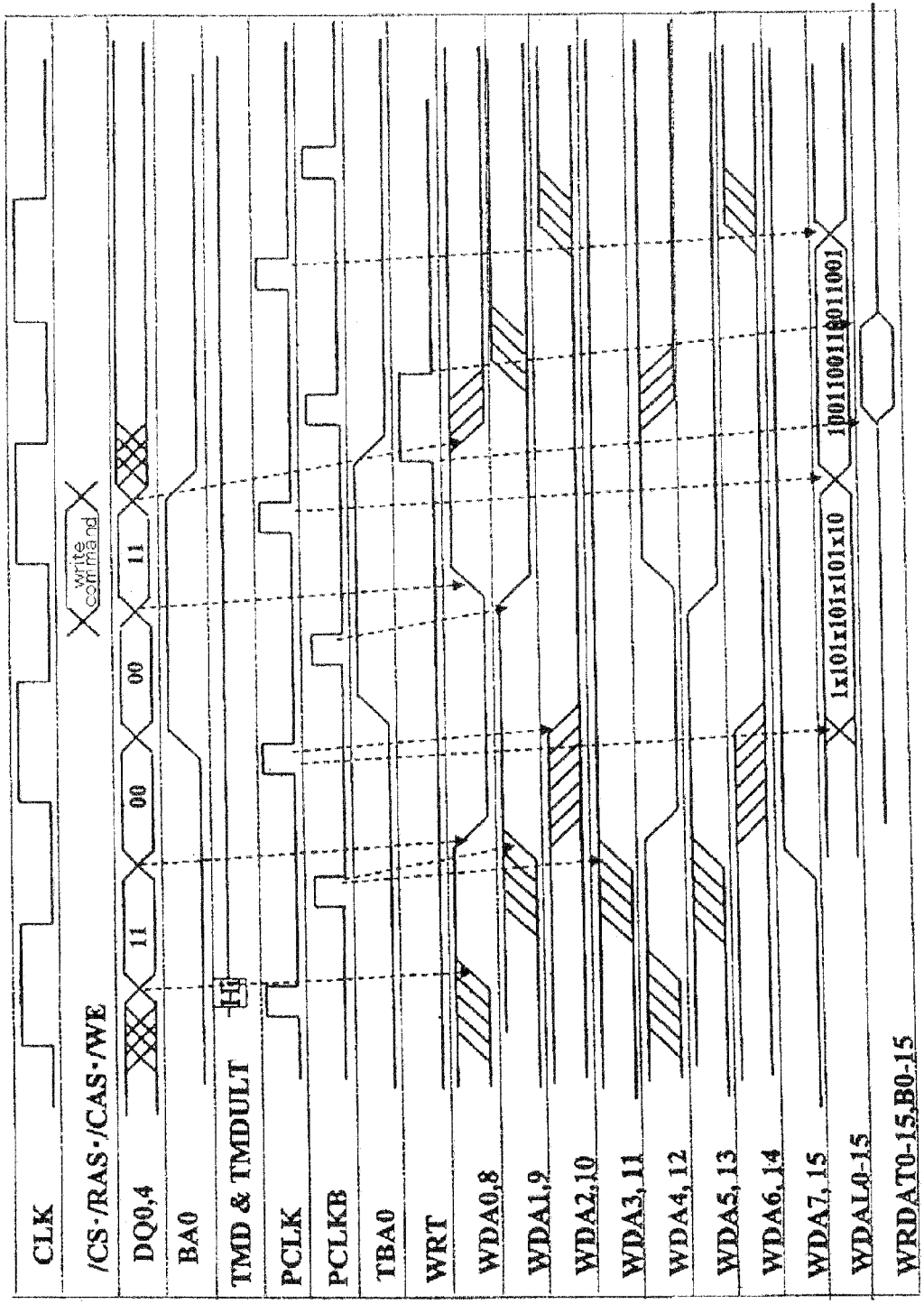

FIG. 14 is a timing chart for illustrating the operation of the semiconductor storage of the present embodiment. Here, it is assumed that IO pins of the measuring apparatus are connected to DQ0 and DQ4. It is also assumed that the measuring apparatus inputs a CLK signal, external commands, a ADL signal, a /WP signal and a TBA0 signal to the semiconductor storage. It is also assumed that a TMD signal and a TMDULT signal are set in active states.

To begin with, the measuring apparatus, setting the BA0 signal at the L-level, inputs data for DQ terminals DQ3 and DQ7, to DQ terminals DQ0 and DQ4, in synchronization with the falling edge of the CLK signal two pulse ahead of the input of the control command representing a write command.

The input data are latched by each latch circuit L3, based on the signal representing the logical sum of the PCLKB signal generated in synchronization with the falling edge of the CLK signal and the external input signal. The latched data are each supplied as write data from each transfer gate T3 to IO lines WDA3 and WDA7, respectively.

Thereafter, the measuring apparatus inputs data for DQ terminals DQ2 and DQ6 to DQ terminals DQ0 and DQ4, in synchronization with the rising edge of the next CLK signal.

The input data are latched by each latch circuit L2, based on the signal representing the logical sum of the PCLK signal generated in synchronization with the rising edge of the CLK signal and the external input signal. The latched data are each supplied as write data from each transfer gate T2 to IO lines WDA2 and WDA6, respectively Subsequently, when inputting the data for DQ terminals DQ2 and DQ6, the measuring apparatus changes the BA0 signal to the active state (H-level) before the falling edge of the CLK signal. Then, the measuring apparatus inputs a control command representing a write command in synchronization with the falling edge of the CLK signal and inputs data for DQ terminals DQ0 and DQ4 to DQ terminals DQ0 and DQ4. The input data are each supplied as write data to IO lines WDA0 and WDA4, respectively.

The write data supplied by degeneration circuit 113 to the aforementioned IO lines WDA0~WDA7 are also supplied to IO lines WDA8~15, respectively.

Thereafter, the data input to IO lines DWA0~15 are latched by latch circuits LA0 and LA15 based on the PCLK signal which is generated in synchronization with the Rise edge of the CLK signal.

Then, when the WRT signal, generated by command decoder 102 in accordance with the write command is input to transfer gates TG0~TG15, the items of data latched by latch circuits LA0 and LA 15, are each output to memory cell array 105 from transfer gates TG0~TG15, respectively, via complementary signal lines PWRDAT0~3 and PWRDAB0~3. The output write data items are each written into individual memory cells.

Next, the effect will be described.

In the present embodiment, by-path route B2 latches the data input to DQ terminal DQ0 in synchronization with the logical sum between the PCKL signal and the TBA0 signal and supplies the latched data as write data to IO line WDA2.

In this case, it becomes possible to write data individually into three memory cells into which data is written or from which data is read out, in parallel through one DQ terminal based on activation of one Y-switch changeover signal.

Further, in the present embodiment, by-path route B2 latches the data input to DQ terminal DQ0 in synchronization with the logical sum between PCKLB signal and the TBA0 signal and supplies the latched data as write data to IO line WDA3.

In this case, it becomes possible to write data individually into four memory cells into which data is written or from which data id read out, in parallel through one DQ terminal based on activation of one Y-switch changeover signal.

Also, in the present embodiment, the predetermined number is 8, and there are 16 DQ terminals. Further, there are by-path routes for supplying the data input to DQ terminal DQ0, to IO lines WDA4~WDA7.

Accordingly, when data is written into, or read out from, eight memory cells, in parallel based on activation of one Y-switch changeover signal and there are 16 DQ terminals, it becomes possible to write data individually into the memory cells into which data can be written or from which data can read out, in parallel based on activation of one Y-switch changeover signal while it is possible to reduce the 16 DQ terminals into two DQ terminals.

It is apparent that the present invention is not limited to the above embodiments, but may be modified and changed without departing from the scope and spirit of the invention.

What is claimed is:

1. A semiconductor device comprising:
   first and second input/output terminals;
   a first input/output line connected to said first input/output terminal;
   a second input/output line connected to said second input/output terminal; and
   a first by-path route connected between said first input/output line and said second input/output line,
   wherein
   when in normal operation mode, said first by-path route is in a non-conductive state, and
   when in a test mode, said first by-path route is set into a conductive state so that a first data inputted to said first input/output terminal is outputted as a first input data to said second input/output line, in correspondence with a transition of a clock signal in the first direction, and so that a second data inputted to said first input/output terminal is outputted as a second input data for said first input/output line, in correspondence with a transition of said clock signal in the second direction.

2. The semiconductor device according to claim 1, further comprising:
   a first latch circuit connected in said first by-path route, wherein said first latch circuit latches the first data supplied to said first input/output terminal, in synchronization with the transition of said clock signal in said first direction and supplies the first data to said second input/output line.

3. The semiconductor device according to claim 1, further comprising:

a first transfer gate connected in said first by-path route; and
   a second transfer gate connected between said second input/output terminal and said second input/output line, wherein
   a test mode signal that represents said test mode is input to control terminals of said first and second transfer gates,
   when said test mode signal is in the non-active state, said first transfer gate is in the non-active state and said second transfer gate is in the conductive state, and,
   when said test mode signal is in the active state, said first transfer gate is in the active state and said second transfer gate is in the non-conductive state.

4. The semiconductor device according to claim 1, further comprising:
   third and fourth input/output terminals;
   third input/output line connected to said third input/output terminal;
   fourth input/output line connected to said fourth input/output terminal;
   a second by-path route connected between said first input/output line and said third input/output line; and
   a third by-path route that connected between said first input/output line and said fourth input/output line, wherein
   when in said normal operation mode, said second and third by-path routes are in non-conductive states,
   when in said test mode, said second and third by-path routes are set into conductive states,
   when in said test mode, a third data supplied to said first input/output terminal is outputted as a third input data to said second or said fourth input/output line in correspondence with an additional of the clock signal in the first direction, a fourth data supplied to said first input/output terminal is outputted as a fourth input data to said third input/output line in correspondence with an additional transition of the clock signal in the second direction.

5. The semiconductor device according to claim 4, wherein a timing which said first data is latched and a timing which said third data is latched are controlled based on a bank address signal and a timing which said second data is latched and a timing at which said fourth data is latched are controlled based on said bank address signal.

6. The semiconductor device according to claim 5, further comprising:
   a first latch circuit connected in said first by-path route;
   a second latch circuit connected in said second by-path route; and
   a third latch circuit connected in said third by-path route, wherein
   said first latch circuit latches said first data supplied to said first input/output terminal in synchronization with the first transition of said clock signal in said first direction and supplies said first data to said second input/output line,
   said second latch circuit latches said fourth data supplied to said first input/output terminal from the outside in synchronization with the transition of said clock signal in said second direction and supplies said fourth data to said third input/output line, and,
   said third latch circuit latches said third data supplied to said first input/output terminal from the outside in synchronization with the second transition of said clock signal in said first direction and supplies said third data to said fourth input/output line.

7. The semiconductor device according to claim 6, further comprising:
- a generating circuit generating a first pulse signal and a second pulse signal in synchronization with transitions of said clock signal in the first direction and in the second direction, respectively; wherein
- a first logical circuit supplied a first signal to a clock terminal of said second latch circuit, the first signal generated by performing a logic operation on logic levels of said first pulse signal and said bank address signal; and
- a second logical circuit supplied a second signal to a clock terminal of said third latch circuit, the second signal generated by performing a logic operation on logic levels of said second pulse signal and said bank address.

8. The semiconductor device according to claim 4, further comprising:
- a first transfer gate connected in said first by-path route;
- a second transfer gate connected between the route that connects said second input/output terminal and said second input/output line;
- a third transfer gate connected in said second by-path route;
- a fourth transfer gate connected between the route that connects said third input/output terminal and said fourth input/output line;
- a fifth transfer gate connected in said third by-path route;
- a sixth transfer gate connected between the route that connects between said fourth input/output terminal and said sixth input/output line;
- a test mode signal that represents said test mode is input to control terminals of said first through sixth transfer gates,
- when said test mode signal is in the non-active state, said first, third and fifth transfer gates are in non-active states and said second, fourth and sixth transfer gates are in conductive states, and,
- when said test mode signal is in the active state, said first, third and fifth transfer gates are in conductive states and said second, fourth and sixth transfer gates are in non-conductive states.

9. The semiconductor device according to claim 1, wherein said transition in the first direction is a falling transition of said clock signal and said transition in the second direction is a rising transition of said clock signal.

10. A semiconductor device comprising:
- an internal circuit;
- a first terminal receiving first and second data;
- a first line coupled between the first terminal and the internal circuit;
- a second line coupled to the internal circuit; and
- a by-path section configured to electrically connect the first and second lines with each other so as to convey one of the first and second data to the second lines when the first terminal receives the one of the first and second data, and to electrically separate the first and second lines from each other so as to convey the other of the first and second data to the first line when the first terminal receives the other of the first and second data.

11. The semiconductor device as claimed in claim 10, further comprising a second terminal coupled to the second line, and wherein the first terminal receives the first and second data in a test mode and a third data in a normal operation mode, the second terminal receives a fourth data in the normal operation mode, and the by-path section is configured to electrically separate the first and second lines from each other in the normal operation mode so as to convey the third and fourth data respectively to the first and second lines.

12. The semiconductor device as claimed in claim 10, wherein the first terminal receives, in the test mode, the one of the first and second data followed by receiving the other of the first and second data.

13. The semiconductor device as claimed in claim 10, further comprising a clock generating circuit generating a clock signal, and wherein the first terminal receives, in the test mode, the one of the first and second data in response to one of rising and falling edges of the clock signal and the other of the first and second data in response to the other of rising and falling edges of the clock signal following the one of the rising and falling edges.

14. The semiconductor device as claimed in claim 10, wherein the by-path section includes a latch circuit holding the one of the first and second data, when the first terminal receives the other of the first and second data, so that the second line is supplied with the one of the first and second data.

15. The semiconductor device as claimed in claim 10, wherein the internal circuit comprises;
- a memory cell array including a plurality of memory cells and first and second bit lines each coupled at least one of the plurality of memory cells,
- first and second amplifier circuits coupled respectively to the first and second bit lines,
- a first switch circuit coupled between the first amplifier circuit and the first line, the first switch circuit, when rendered conductive, connect the first amplifier circuit and the first lien,
- a second switch circuit coupled between the second amplifier circuit and the second line, the second switch circuit, when rendered conductive, connect the second amplifier circuit and the second lien, and
- a control circuit supplying in common to the first and second switch circuits with a control signal so as to render the first and second switch circuits conductive substantially simultaneously.

* * * * *